US011664056B2

(12) United States Patent
Lin

(10) Patent No.: US 11,664,056 B2
(45) Date of Patent: May 30, 2023

(54) METHOD AND APPARATUS FOR ACCESSING TO DATA IN RESPONSE TO POWER-SUPPLY EVENT

(71) Applicant: Silicon Motion, Inc., Zhubei (TW)

(72) Inventor: Wen-Sheng Lin, Kaohsiung (TW)

(73) Assignee: Silicon Motion, Inc., Zhubei (TW)

( * ) Notice: Subject to any disclaimer, the term of this patent is extended or adjusted under 35 U.S.C. 154(b) by 0 days.

(21) Appl. No.: 17/723,989

(22) Filed: Apr. 19, 2022

(65) Prior Publication Data

US 2022/0246181 A1 Aug. 4, 2022

Related U.S. Application Data

(62) Division of application No. 17/108,681, filed on Dec. 1, 2020, now Pat. No. 11,342,008.

(30) Foreign Application Priority Data

Apr. 14, 2020 (CN) .......................... 202010288541.4

(51) Int. Cl.
*G11C 5/14* (2006.01)
(52) U.S. Cl.
CPC .............. *G11C 5/141* (2013.01); *G11C 5/147* (2013.01)
(58) Field of Classification Search
CPC ..... G11C 5/141; G11C 5/147; G11C 16/0483; G11C 5/143; G11C 16/10; G11C 16/225; G11C 16/30; G11C 7/24; G06F 11/1048; G06F 11/1072; G06F 11/108; G06F 11/1438; G06F 12/0246
See application file for complete search history.

(56) References Cited

U.S. PATENT DOCUMENTS 9,484,069 B2 11/2016 Shim et al.
2011/0128785 A1 6/2011 Seo
2015/0043280 A1 2/2015 Pao
(Continued)

FOREIGN PATENT DOCUMENTS

CN 107301132 A 10/2017
CN 109165115 A 1/2019
(Continued)

OTHER PUBLICATIONS

English translation of the Taiwanese Search Report, dated Jun. 29, 2021, for Taiwanese Application No. 109112469.

*Primary Examiner* — Khamdan N. Alrobaie
(74) *Attorney, Agent, or Firm* — Birch, Stewart, Kolasch & Birch, LLP

(57) ABSTRACT

The invention relates to a method, and an apparatus for accessing to data in response to a power-supply event. The method, performed by a flash controller, includes steps for: reading a plurality of physical pages of data in a current block from a flash module during a sudden power off recovery procedure; determining whether a power-supply event has occurred according to an error correction result corresponding to read physical pages; reconstructing a first flash-to-host mapping (F2H) table to include physical-to-logical mapping (P2L) information from the $0^{th}$ page to a page before a last valid page in the current block when the power-supply event has occurred; and programming the reconstructed first F2H table into a location of the flash module.

20 Claims, 7 Drawing Sheets

(56) References Cited

U.S. PATENT DOCUMENTS

| | | | | |
|---|---|---|---|---|
| 2015/0113237 A1* | 4/2015 | Kim | ............... | G11C 16/3427 |
| | | | | 711/162 |
| 2017/0068488 A1* | 3/2017 | Shibatani | ............... | G11C 16/10 |
| 2018/0101302 A1* | 4/2018 | Lin | ............... | G06F 12/0246 |
| 2018/0101303 A1 | 4/2018 | Lin | | |
| 2018/0150357 A1* | 5/2018 | Shen | ............... | G06F 11/1441 |
| 2018/0285213 A1* | 10/2018 | Kim | ............... | G06F 11/1048 |
| 2018/0330684 A1 | 11/2018 | Guo et al. | | |
| 2019/0196960 A1* | 6/2019 | Lin | ............... | G11C 16/10 |
| 2020/0168283 A1* | 5/2020 | You | ............... | G11C 16/349 |
| 2020/0210303 A1* | 7/2020 | Ji | ............... | G06F 11/1048 |
| 2020/0301780 A1* | 9/2020 | Kim | ............... | G06F 11/108 |
| 2021/0158878 A1 | 5/2021 | Okako et al. | | |

FOREIGN PATENT DOCUMENTS

| | | |
|---|---|---|
| TW | 531698 B | 5/2003 |
| TW | I482161 B | 4/2015 |
| TW | I645290 B | 12/2018 |
| TW | I670640 B | 9/2019 |

* cited by examiner

| 610 | 630 |
|---|---|
| P#0 | LBA#100~107 |
| P#1 | LBA#150~157 |
| P#2 | LBA#270~277 |
| P#3 | LBA#5122 |
| P#4 | LBA#31294 |
| P#5 | LBA#277~284 |
| P#6 | LBA#912~919 |
| P#7 | LBA#920~927 |
| P#8 | LBA#928~935 |
| ⋮ | ⋮ |
| P#253 | NULL |
| P#254 | NULL |
| P#255 | NULL |

FIG. 6

METHOD AND APPARATUS FOR ACCESSING TO DATA IN RESPONSE TO POWER-SUPPLY EVENT

CROSS-REFERENCE TO RELATED APPLICATIONS

This is a Divisional application of and claims the benefit of priority to U.S. patent application Ser. No. 17/108,681, filed on Dec. 1, 2020, which claims the benefit of priority to Patent Application No. 202010288541.4, filed in China on Apr. 14, 2020; the entirety of which is incorporated herein by reference for all purposes.

BACKGROUND

The disclosure generally relates to storage devices and, more particularly, to a method, and an apparatus for accessing to data in response to a power-supply event.

Flash memory devices typically include NOR flash devices and NAND flash devices. NOR flash devices are random access—a central processing unit (CPU) accessing a NOR flash device can provide the device any address on its address pins and immediately retrieve data stored in that address on the device's data pins. NAND flash devices, on the other hand, are not random access but serial access. It is not possible for NAND to access any random address in the way described above. Instead, the CPU has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word.

A sudden power off (SPO) induced by a natural or man-made disaster would cause error bits when data is cached in a flash controller, leading to the wrong data to be programmed into a flash module. Thus, it is desirable to have a method, and an apparatus for accessing to data in response to a power-supply event to avoid programming erroneous data, which is caused by unstable power supply, into the flash module, or avoid recovering erroneous data that has been programmed in an unstable power-supply situation.

SUMMARY

In an aspect of the invention, an embodiment introduces a method for accessing to data in response to a power-supply event, performed by a flash controller, to include: repeatedly detecting whether a voltage supplied to the flash controller is lower than a first threshold; and issuing a program command to a flash module for programming data into the flash module and performing a supervision procedure when the voltage is lower than the first threshold.

In another aspect of the invention, an embodiment introduces an apparatus for accessing to data in response to a power-supply event to include: a power detection module; a first interface; and a processing unit. The processing unit is arranged operably to repeatedly detect whether a voltage supplied to the apparatus is lower than a first threshold with the power detection module; drive the first interface to issue a program command to a flash module for programming data into the flash module when the voltage is lower than the first threshold; and perform a supervision procedure when the voltage is lower than the first threshold.

The supervision procedure includes steps for: repeatedly detecting whether the voltage is lower than a second threshold during a time period when issuing the program command to the flash module until transmitting the data to the flash module completely; and cancelling the program command when the voltage is lower than the second threshold. The first threshold is lower than an ideal voltage that the power supply module supply and the second threshold is lower than the first threshold.

In still another aspect of the invention, an embodiment introduces a method for accessing to data in response to a power-supply event, performed by a flash controller, to include: reading physical pages of data in a current block from a flash module during a sudden power off recovery procedure; determining whether a power-supply event has occurred according to an error correction result corresponding to the read physical pages; reconstructing a flash-to-host mapping (F2H) table to include physical-to-logical mapping (P2L) information from the $0^{th}$ page to a page before a last valid page in the current block when the power-supply event has occurred; and programming the reconstructed F2H table into a location of the flash module.

In still another aspect of the invention, an embodiment introduces an apparatus for accessing to data in response to a power-supply event to include: a flash interface; and a processing unit. The processing unit is arranged operably to drive the flash interface to read a plurality of physical pages of data in a current block from the flash module during a sudden power off recovery procedure; determine whether a power-supply event has occurred according to an error correction result corresponding to the read physical pages; reconstruct a F2H table to include P2L information from the $0^{th}$ page to a page before a last valid page in the current block when the power-supply event has occurred; and drive the flash interface to program the reconstructed F2H table into a location of the flash module.

Both the foregoing general description and the following detailed description are examples and explanatory only, and are not restrictive of the invention as claimed.

BRIEF DESCRIPTION OF THE DRAWINGS

FIG. 6 is a schematic diagram showing a physical block and a Flash-to-Host mapping (F2H) table according to an embodiment of the invention.

DETAILED DESCRIPTION

Reference is made in detail to embodiments of the invention, which are illustrated in the accompanying drawings.

The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.)

Figure 1:
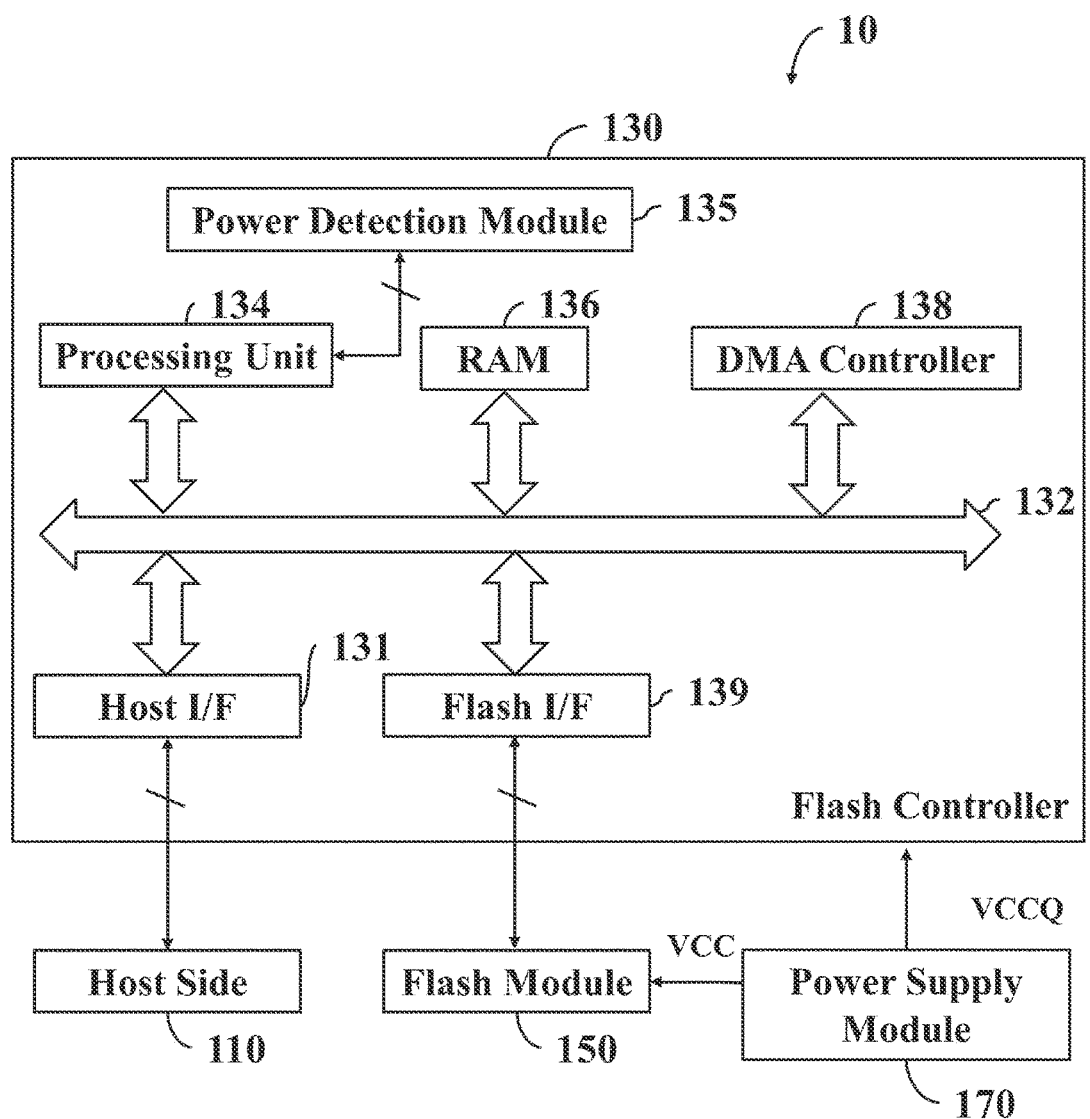
FIG. 1 is the system architecture of an electronic apparatus according to an embodiment of the invention.

Refer to FIG. 1. The electronic apparatus 10 includes a host side 110, a flash controller 130 and a flash module 150, and the flash controller 130 and the flash module 150 may be collectively referred to as a device side. The electronic apparatus 10 may be equipped with a Personal Computer (PC), a laptop PC, a tablet PC, a mobile phone, a digital camera, a digital recorder, or other consumer electronic products. The host side 110 and a host interface (I/F) 131 of the flash controller 130 may communicate with each other by Universal Serial Bus (USB), Advanced Technology Attachment (ATA), Serial Advanced Technology Attachment (SATA), Peripheral Component Interconnect Express (PCI-E), Universal Flash Storage (UFS), Embedded Multi-Media Card (eMMC) protocol, or others. A flash I/F 139 of the flash controller 130 and the flash module 150 may communicate with each other by a Double Data Rate (DDR) protocol, such as Open NAND Flash Interface (ONFI), DDR Toggle, or others. The flash controller 130 includes a processing unit 134 and the processing unit 134 may be implemented in numerous ways, such as with general-purpose hardware (e.g., a single processor, multiple processors or graphics processing units capable of parallel computations, or others) that is programmed using firmware and/or software instructions to perform the functions recited herein. The processing unit 134 receives host commands, such as host read, write, trim, erase commands, through the host I/F 131, schedules and executes these commands. The flash controller 130 includes a Random Access Memory (RAM) 136 and the RAM 136 may be implemented in a Dynamic Random Access Memory (DRAM), a Static Random Access Memory (SRAM), or the combination thereof, for allocating space as a data buffer storing user data (also referred to as host data) that is to be programmed into the flash module 150, and has been read from the flash module 150 and is to be output to the host side 110. The RAM 136 stores necessary data in execution, such as variables, data tables, data abstracts, host-to-flash (H2F) tables, flash-to-host (F2H) tables, and so on. The flash I/F 139 includes a NAND flash controller (NFC) to provide functions that are required to access to the flash module 150, such as a command sequencer, a Low Density Parity Check (LDPC) encoder/decoder, etc.

A bus architecture 132 may be configured in the flash controller 130 for coupling between components to transfer data, addresses, control signals, etc., which include the host I/F 131, the processing unit 134, the RAM 136, the direct memory access (DMA) controller 138, the flash I/F 139, and so on. The DMA controller 138 may move data between the components through the bus architecture according to instructions issued by the processing unit 134, for example, moving data in a specific data buffer of the host I/F 131 or the flash I/F 139 to a specific address of the RAM 136, moving data in a specific address of the RAM 136 to a specific data buffer of the host I/F 131 or the flash I/F 139, or others.

The bus includes a set of parallel physical-wires connected to two or more components of the flash controller 130. The bus is a shared transmission medium so that only two devices can access to the wires to communicate with each other for transmitting data at any one time. Data and control signals travel in both directions between the components along data and control lines, respectively. Addresses on the other hand travel only one way along address lines. For example, when the processing unit 134 wishes to read data from a particular address of the RAM 136, the processing unit 134 sends this address to the RAM 136 on the address lines. The data of that address is then returned to the processing unit 134 on the data lines. To complete the data read operation, control signals are sent along the control lines.

The flash module 150 provides huge storage space typically in hundred Gigabytes (GB), or even several Terabytes (TB), for storing a wide range of user data, such as high-resolution images, video files, etc. The flash module 150 includes control circuits and memory arrays containing memory cells that can be configured as Single Level Cells (SLCs), Multi-Level Cells (MLCs), Triple Level Cells (TLCs), Quad-Level Cells (QLCs), or any combinations thereof. The processing unit 134 programs user data into a designated address (a destination address) of the flash module 150 and reads user data from a designated address (a source address) thereof through the flash I/F 139. The flash I/F 139 may use several electronic signals run on physical wires including data lines, a clock signal line and control signal lines for coordinating the command, address and data transfer with the flash module 150. The data lines may be used to transfer commands, addresses, read data and data to be programmed; and the control signal lines may be used to transfer control signals, such as Chip Enable (CE), Address Latch Enable (ALE), Command Latch Enable (CLE), Write Enable (WE), etc.

The electronic apparatus 10 includes a power supply module 170 and the power supply module 170 includes two pins VCC and VCCQ for providing voltages of 3.3V and 1.8V to the flash module 150 and the flash controller 130, respectively. To detect a sudden power off (SPO) induced by a natural or man-made disaster, or unstable power supply, the flash controller 130 includes a power detection module 135 for measuring a voltage provided by the power supply module 170 through the pin VCCQ. The processing unit 134 may poll the power detection module 135 periodically to obtain the current voltage provided by the power supply module 170 through the pin VCCQ.

Figure 2:
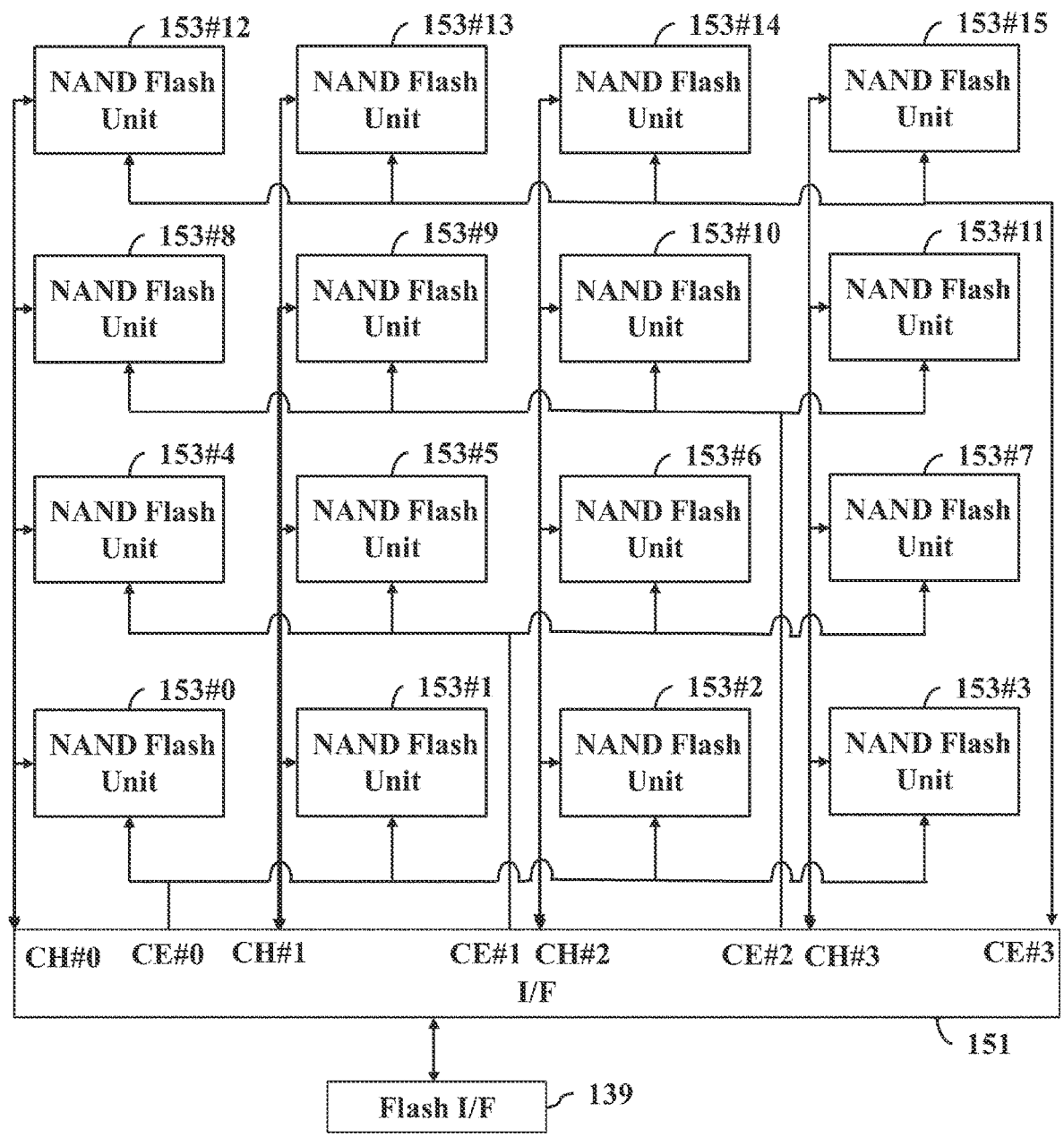
FIG. 2 is a schematic diagram illustrating a flash module according to an embodiment of the invention.

Refer to FIG. 2. The flash I/F 151 of the flash module 150 may include four I/O channels (hereinafter referred to as channels) CH #0 to CH #3 and each is connected to four NAND flash units, for example, the channel CH #0 is connected to the NAND flash units 153 #0, 153 #4, 153 #8 and 153 #12. Each NAND flash unit can be packaged in an independent die. The flash I/F 139 may issue one of the CE signals CE #0 to CE #3 through the I/F 151 to activate the NAND flash units 153 #0 to 153 #3, the NAND flash units 153 #4 to 153 #7, the NAND flash units 153 #8 to 153 #11, or the NAND flash units 153 #12 to 153 #15, and read data from or program data into the activated NAND flash units in parallel.

Figure 3:
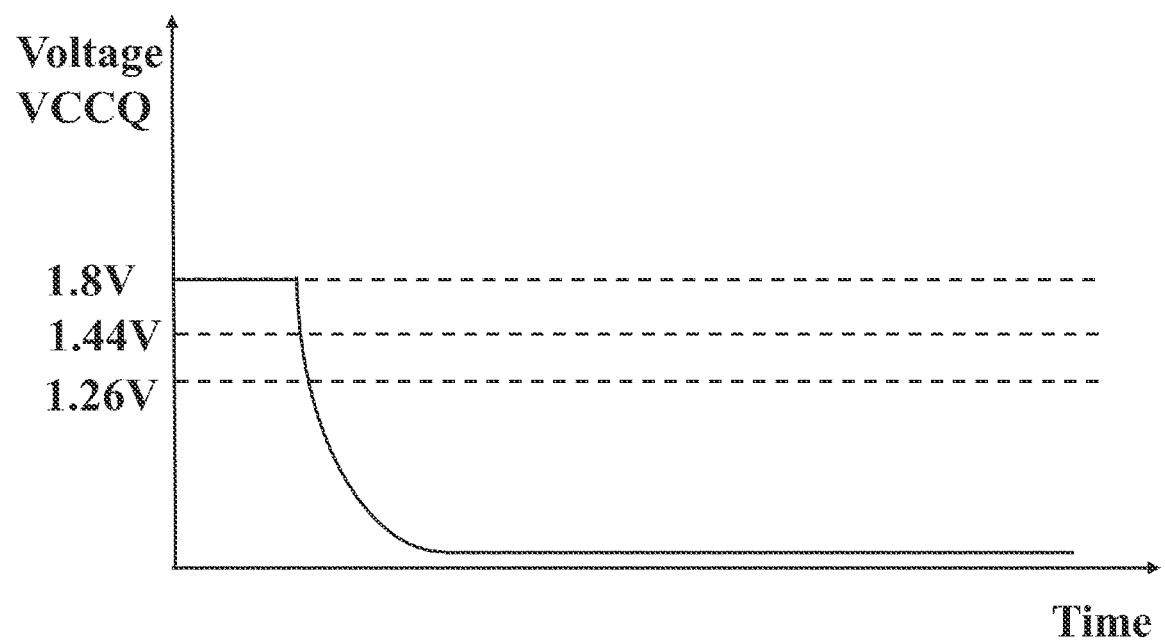
FIG. 3 is a schematic diagram illustrating variations of a voltage supplied to a flash controller according to an embodiment of the invention.

A SPO induced by a natural or man-made disaster, or unstable power supply may cause unexpected results when the flash controller 130 programs data into the flash module 150. To respond to possible power events, such as a SPO, unstable power supply, etc., the flash controller 130 repeatedly detects a voltage supplied to the flash controller 130 and provides two thresholds TH1 and TH2 during a data programming, where the threshold TH1 (i.e. a first threshold) is lower than the ideal voltage that the power supply module 170 should provide, and the threshold TH1 is higher than the threshold TH2 (i.e. a second threshold). Refer to FIG. 3. For example, if the ideal voltage that the power supply module 170 should supply is 1.8V, then the threshold TH1 may be set to 1.44V and the threshold TH2 may be set to 1.26V. Usually, when the voltage supplied to the flash controller 130 is lower than 1.2V, the flash controller 130 (such as, specifically, the RAM 136, the flash I/F 139, etc.) would malfunction to damage data to be programmed into the flash module 150. Therefore, when the detected voltage is lower than the threshold TH1, a supervision procedure is performed. In the supervision procedure, the flash controller 130 repeatedly detects whether the supplied voltage is lower than the threshold TH2 during a time period when the flash controller 130 issues a program command to the flash module 150 until the flash controller 130 transmits the data to be programmed into the flash module 150 completely. Once detecting that the supplied voltage is lower than the threshold TH2, the flash controller 130 cancels the program command. Thus, refer to FIG. 4. An embodiment of the invention introduces a method for programming data in response to a power-supply event, performed by a processing unit 134 when loading and executing relevant firmware or software instructions. Detailed steps are described as follows:

Step S410: It is detected whether the voltage supplied to the flash controller 130 is lower than the threshold TH1. If so, the process proceeds to step S430. Otherwise, the process proceeds to step S420. The processing unit 134 may poll the power detection module 135 to obtain the current voltage provided by the power supply module 170 through the pin VCCQ. The voltage being higher than or equal to the threshold TH1 indicates that the power supply is stable, and the processing unit 134 may drive the flash I/F 139 directly to issue a program command to the flash module 150 and then exits the data-programming operation, thus, the supervision procedure is unnecessary to perform. The voltage being lower than the threshold TH1 indicates that the power supply is unstable and an SPO may occur, and the processing unit 134 needs to perform a supervision procedure to ensure that the execution of the program command is less damaged by the unstable power supply.

Step S420: A write instruction is issued to the flash I/F 139 to drive the flash I/F 139 to program designated data into the flash module 150. The processing unit 134 may store the write instruction in an instruction queue of the flash I/F 139, which includes information, such as an instruction code, an instruction number, a data length, a specific address of the RAM 136 that stores data to be programmed, etc. Subsequently, the flash I/F 139 reads data from the specific address of the RAM 136 according to the information carried in the write instruction, transmits the read data to the flash module 150, and performs a series of signal and/or message exchanges with the flash module 150 to complete the write instruction. It would be understood that, when the power supply is stable, the processing unit 134 leaves the data-programming operation after issuing the write instruction to the flash I/F 139, without waiting for the flash module 150 to physically program data completely, so that the processing unit 134 continues to process other tasks.

Figure 5:
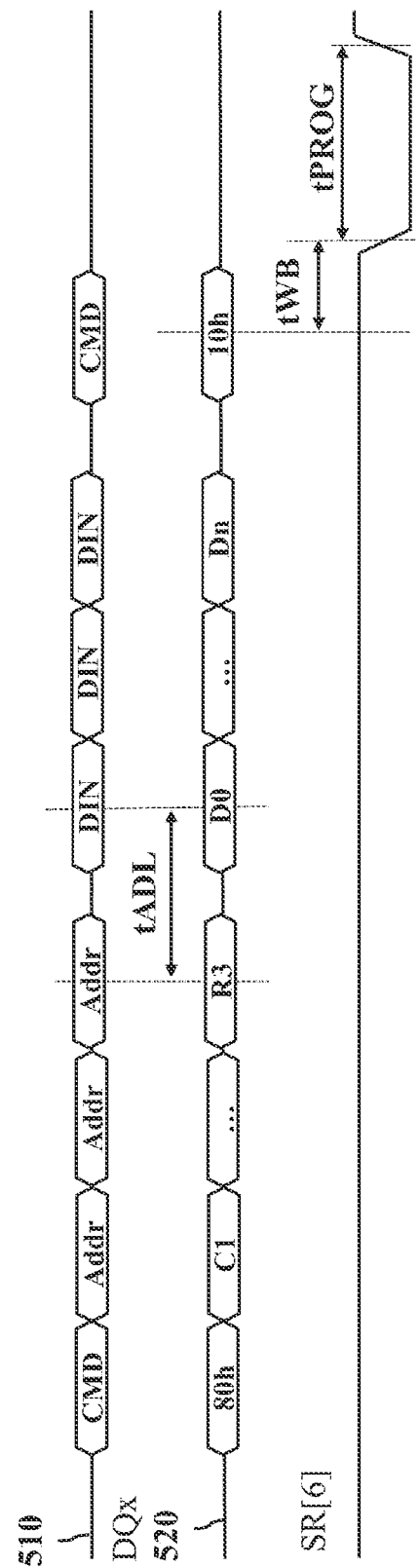
FIG. 5 is a timing diagram for a Page Program command according to an embodiment of the invention.

Refer to FIG. 5 illustrating a timing diagram for a Page Program (80h-10h) command. The waveform 510 shows a clock pattern for the data line DQx coupled between the flash module 150 and the flash I/F 139 and the waveform 520 shows an exemplary Page Program command, in which "80h" indicates the main command and "10h" indicates the confirmation command. The flash I/F 139 may issue a Page Program command to the flash module 150 to transfer one page or a portion of one page of data identified by a physical address to a page register of the flash module 150 according to a write instruction of the instruction queue. The content of the page register is then programmed into the memory array at the physical addresses indicated. Cycles C1 to C2 indicate column addresses of the starting buffer location to write data to. Cycles R1 to R3 indicate row addresses of the page being programmed. Cycles D0 to Dn indicate data bytes/words to be programmed to the addressed page. The time interval "tADL" represents the time required from the last address cycle to the first data cycle, and the time interval "tWB" represents the time required to start programming data into the memory array after the confirmation command "10h" is issued. When detecting a write instruction, the flash I/F 139 may issue the main command "80h" to the flash module 150, and then, transmit a row address, a column address and data to the flash module 150. After transmitting the last data byte or word to the flash module 150, the flash I/F 139 may send a data ready message to the processing unit 134 to inform that data for this write instruction has been transmitted to the flash module 150 completely, and issue the confirmation command "10h" to the flash module 150. To reflect the received data ready message, the processing unit 134 may update a status variable in the RAM 136 to record information indicating that data for this write instruction has been transmitted to the flash module 150 completely.

Step S430: A write instruction is issued to the flash I/F 139 to drive the flash I/F 139 to program the designated data into the flash module 150. Technique details performed by the flash I/F 139 after receiving the write instruction may refer to the description of step S420 described above, and are omitted for brevity. When the power supply is unstable, the processing unit 134 cannot leave the data-programming operation instantly after issuing the write instruction to the flash I/F 139, and needs to perform the supervision procedure to ensure that the execution of the write instruction is less damaged by the unstable power supply. The supervision procedure may include the operations in steps S440 to S480.

Step S440: It is detected whether the voltage provided to the flash controller 130 is lower than the threshold TH2. If so, the process proceeds to step S450. Otherwise, the process proceeds to step S470. The processing unit 134 may poll the power detection module 135 to obtain the current voltage provided by the power supply module 170 through the pin VCCQ. The voltage being lower than the threshold TH2 indicates that the power supply is extremely unstable, and the execution of the write instruction needs to be interrupted.

Step S450: A cancellation instruction is issued to the flash I/F 139, which may include information about the instruction number of the previously issued write instruction, to interrupt the execution of this write instruction. Refer to FIG. 5. Since the data for this write instruction hasn't been transmitted to the flash module 150 completely, the flash I/F 139 when receiving the cancellation instruction may omit the transmission of the remaining portion of data and the confirmation command "10h" to the flash module 150.

Step S460: The flash module 150 is re-activated through the flash I/F 139 to clear relevant content for the unfinished write instruction, for example, the content of the row address register, the column address register and the page register in the flash module 150.

Step S470: It is determined whether the data to be programmed for the write instruction has been transmitted to the flash module 150 completely. If so, the process leaves the data-programming operation. Otherwise, the process proceeds to step S480. The processing unit 134 may determine whether the data ready message has been received from the flash I/F 139 according to the status variable stored in the RAM 136. If so, it means that the programming operation performed by the flash module 150 cannot be stopped, and the processing unit 134 leaves the data-programming operation and may continue to process other tasks.

Step S480: The process waits for a preset period of time.

In other words, steps S440, S470 and S480 form a loop that is periodically executed for repeatedly checking whether the conditions described in steps S440 and S470 are satisfied until the condition described in step S440 or S470 has been met.

The supervision procedure as described above would avoid to program erroneous data that is damaged due to an SPO or unstable power supply into the flash module 150.

To make the data-programming operation more efficient, referring to FIG. 6, each NAND flash unit 153 provides a physical block 610 as a current block, containing multiple pages of space, such as a total of 256 pages P #0 to P #255. Each page in the current block is an empty page initially. In regular situations, the processing unit 134 drives the flash I/F 139 to program data from the $0^{th}$ page of the current block 610 to the last page thereof. Each page of space is used to store data related to one or more logical block address (LBAs). The flash I/F 139 includes an error correction code (ECC) encoder for generating an ECC according to data read from the RAM 136 and programs the read data together with the ECC into one page in a physical block, thereby enabling error bits occurred in the data read from this page to be recovered. The ECC may be Low-Density Parity Check Code (LDPC), Bose-Chaudhuri-Hocquenghem Code (BCH), or others. Taking 1 KB of user data as an example, BCH code can be used to correct at most 72 error bits while LDPC can be used to correct at most 128 error bits. After the last page of data and ECC is programmed, the processing unit 134 collects information regarding LBAs related to each physical page and generate a flash-to-host mapping (F2H) table 630, which contains cells corresponding to a total amount of physical pages in the current block. For example, the $0^{th}$ cell of the F2H table 630 records information indicating that the $0^{th}$ physical page stores data related to LBA #100 to LBA #107, the $1^{st}$ cell thereof records information indicating that the $1^{st}$ physical page stores data related to LBA #150 to LBA #157, and so on. Later, the processing unit 134 drives the flash I/F 139 to program the F2H table 630 into a designated location of the flash module 150 for future search. Since then, the content of the physical block 610 will be no longer changed and the physical block is called a data block. Next, the processing unit 134 picks up one block from spare blocks as a current block and continues the subsequent data-programming operation. However, if an SPO occurs when the current block is not full, the processing unit 134 when performing a sudden power off recovery (SPOR) procedure needs to generate an F2H table 630 for the current block and drive the flash I/F 139 to program the generated F2H table 630 into a designated location in the flash module 150.

Figure 4:
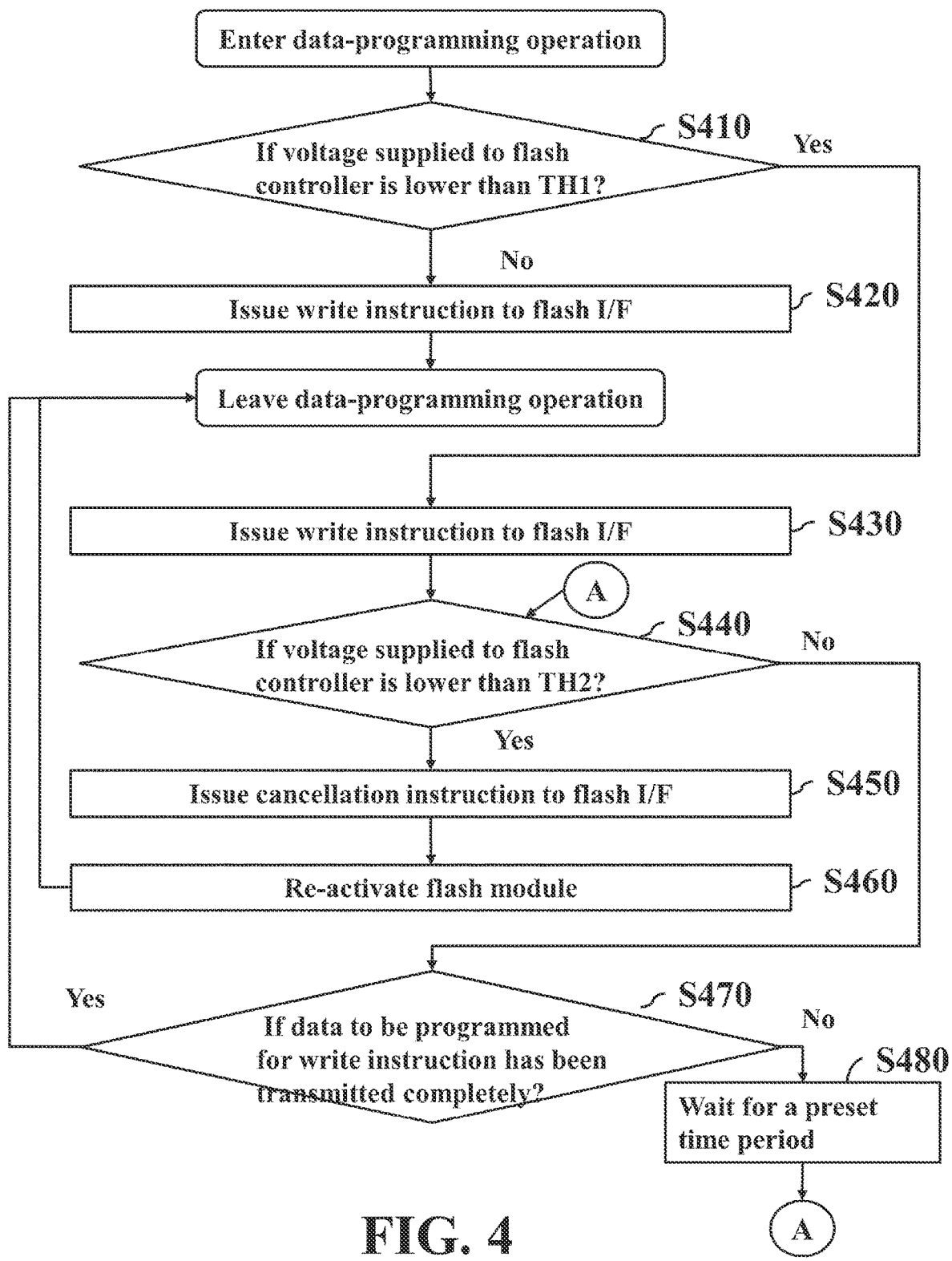
FIG. 4 is a flowchart illustrating a method for programming data in response to a power-supply event according to an embodiment of the invention.
Figure 7:
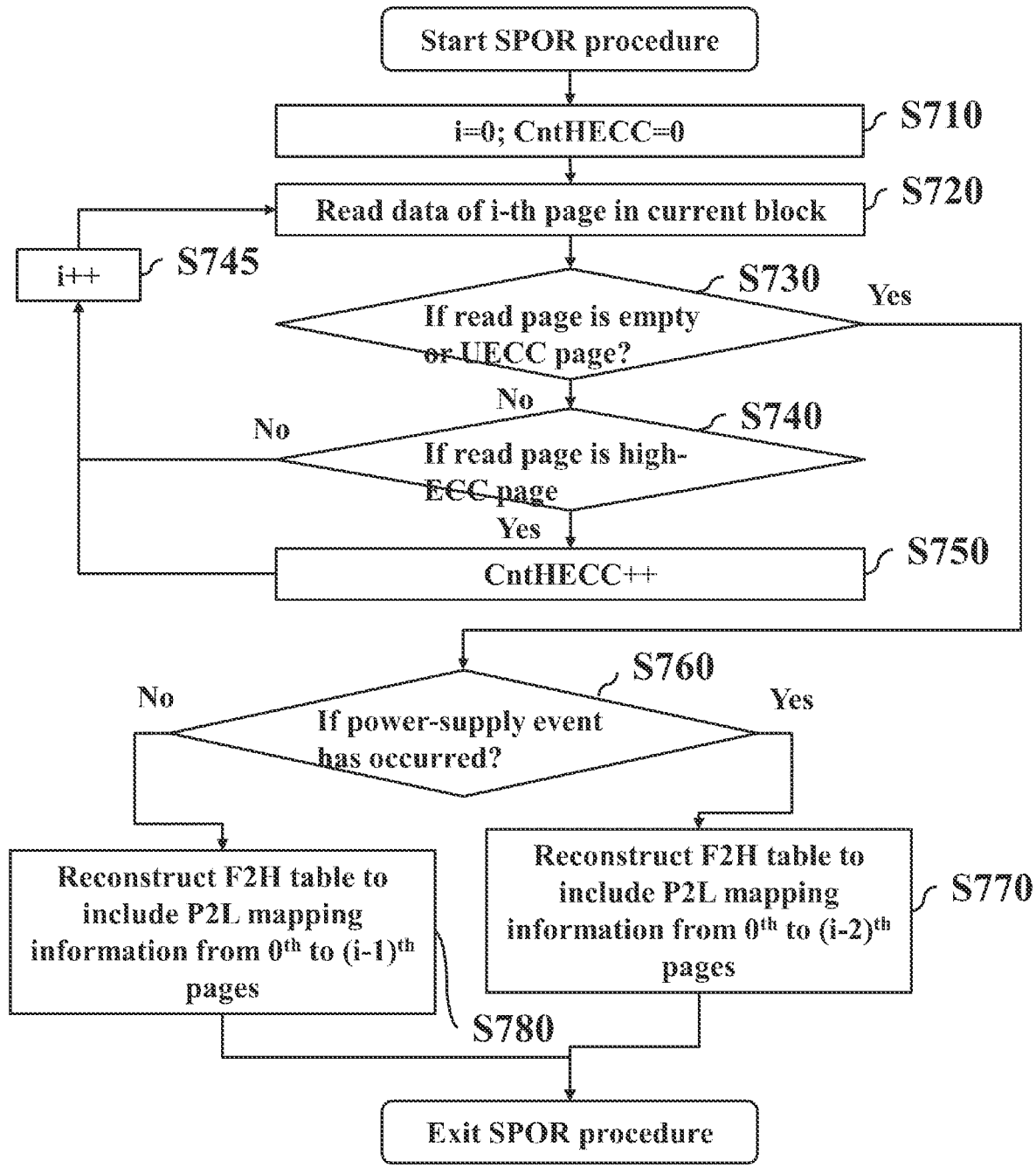
FIG. 7 is a flowchart illustrating a method for reconstructing F2H tables in response to a power-supply event in a sudden power off recovery (SPOR) procedure according to an embodiment of the invention.

In alternative embodiments of the flash controller 130 that is not equipped with the power detection module 135, the prevention mechanism as described in FIG. 4 cannot be realized. In response to such hardware architecture, the flash controller 130 needs to avoid recovering the erroneous data in an SPOR procedure, which was programmed when the power supply is unstable. In the SPOR procedure, the flash controller 130 reads multiple physical pages of data in the current block from the flash module 150 and determines whether a power-supply event has occurred according to the error correction results of the physical pages. When the power-supply event has occurred, the flash controller 130 reconstructs the F2H table including physical-to-logical mapping (P2L) information from the $0^{th}$ page to the page before the last valid page in the current block. When the power-supply event hasn't occurred, the flash controller 130 reconstructs the F2H table including P2L information from the $0^{th}$ page to the last valid page in the current block. Subsequently, the flash controller 130 programs the reconstructed F2H table into the flash module 150. Specifically, the last valid page indicates the last physical page containing data that is error-free or can be corrected, and the reconstructed F2H table includes information indicating which logical address that data stored in each physical page of the current block are related to. An embodiment of the invention introduces a method for reconstructing a F2H table in response to a power-supply event, performed by the processing unit 134 when loading and executing relevant firmware or software instructions for a SPOR procedure. Refer to FIG. 7. Detailed steps are described as follows:

Step S710: The variables "i" and "CntHECC" are set to 0. The processing unit 134 uses the variable "i" to record the page number of data to be read or is being read in the current block, and uses the variable "CntHECC" to record the total number of high-ECC pages in the current block.

Step S720: Data of the $i^{th}$ page in the current block is read. The processing unit 134 may drive the flash I/F 139 to read data of the $i^{th}$ page in the current block. In addition to the data of the $i^{th}$ page in the current block, the flash I/F 139 reads the ECC of the $i^{th}$ page. The flash I/F 139 is equipped with an ECC decoder for correcting error bits of data of each read page with the ECC and reports the error correction results to the processing unit 134. In some embodiments, each error correction result may indicate one of several statuses: error-free; low-error correction (–EC); high-EC; and uncorrectable ECC (UECC). The low-EC status means that the corrected bits by the flash I/F 139 do not exceed the predefined threshold. The high-EC status means that the corrected bits by the flash I/F 139 exceeds the predefined threshold. For example, the threshold is set to 80% of the maximum correction capability. The UECC status means that the flash I/F 139 cannot use the ECC to recover the error bits in the read physical page. In alternative embodiments, each error correction result indicates the corrected number of bits, thereby enabling the processing unit 134 to determine that the read page is an error-free, low-EC, high-EC or UECC page accordingly.

Step S730: It is determined whether the read page is an empty page or an UECC page. If so, the process proceeds to step S760. Otherwise, the process proceeds to step S740. The UECC page means that the flash I/F 139 cannot use the ECC to recover the error bits occurred in the read page. When discovering the read page is the empty page or the UECC page, the processing unit 134 speculates that the flash controller 130 may have an SPO during or before programming data into this physical page.

Step S740: It is determined whether the read page is a high-ECC page. If so, the process proceeds to step S750. Otherwise, the process proceeds to step S745. The process unit 134 may refer to the error correction results reported by the flash I/F 139 to complete the judgment.

Step S745: The value of variable "i" is increased by one.

Step S750: The value of variable "CntHECC" is increased by one.

Step S760: It is determined whether a power-supply event has occurred. If so, the process proceeds to step S770. Otherwise, the process proceeds to step S780. If the $(i-1)^{th}$ page is a high-ECC page and the values of variable "i" and "CntHECC" do not satisfy the extreme-usage condition, then the processing unit 134 determines that the power-supply event has occurred. An exemplary formula for the extreme-usage condition is described below:

$$CntHECC/i > TH$$

where TH represents the threshold, which can be set to an arbitrary value between 0.5 and 1 depending on different system requirements. With the above formula, the processing unit 134 may exclude the use of the electronic apparatus 10 in extreme environments, such as the use in a high temperature, different from an SPO. At this time, the $(i-1)^{th}$ page is called the last valid page. In other words, if the last valid page is a high-ECC page and the ratio of high-ECC pages in read physical pages of the current block to the total number of the read physical pages of the current block is lower than the threshold, then the processing unit 134 determines that the power-supply event has occurred.

Step S770: The F2H table is reconstructed to include P2L information from the $0^{th}$ to the $(i-2)^{th}$ pages in the current block and the reconstructed F2H table is programmed into a designated location of the flash module 150. The processing unit 134 may drive the flash I/F 139 to complete the programming operation for the reconstructed F2H table. Since the processing unit 134 determines that the power-supply event has occurred, the $(i-1)^{th}$ page of data is likely to be damaged, rather than the original host data, and should be discarded. Thus, the reconstructed F2H table does not include physical-to-logical information of the $(i-1)^{th}$ page. It is to be understood that the processing unit 134 considers that the $(i-1)^{th}$ page does not store valid data when the reconstructed F2H table does not include P2L information of the $(i-1)^{th}$ page.

Step S780: The F2H table is reconstructed to include P2L information from the $0^{th}$ to the $(i-1)^{th}$ pages in the current block and the reconstructed F2H table is programmed into a designated location of the flash module 150. The processing unit 134 may drive the flash I/F 139 to complete the programming operation for the reconstructed F2H table.

In the SPOR procedure, through the reconstruction of the F2H table that reflects the power-supply event as described above, it would avoid recovering wrong data that has been damaged by an SPO.

Although the embodiments of the invention take one current block as an example, those skilled in the art may apply the mechanism described above to any current block in NAND flash units, such as any current block of the NAND flash units 153 #0 to 153 #15.

Some or all of the aforementioned embodiments of the method of the invention may be implemented in a computer program such as a driver for a dedicated hardware, a firmware translation layer (FTL) of a storage device, or others. Other types of programs may also be suitable, as previously explained. Since the implementation of the various embodiments of the present invention into a computer program can be achieved by the skilled person using his routine skills, such an implementation will not be discussed for reasons of brevity. The computer program implementing some or more embodiments of the method of the present invention may be stored on a suitable computer-readable data carrier such as a DVD, CD-ROM, USB stick, a hard disk, which may be located in a network server accessible via a network such as the Internet, or any other suitable carrier.

Although the embodiment has been described as having specific elements in FIG. 1, it should be noted that additional elements may be included to achieve better performance without departing from the spirit of the invention. Each element of FIG. 1 is composed of various circuits and arranged operably to perform the aforementioned operations. While the process flows described in FIGS. 4 and 7 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for accessing to data in response to a power-supply event, performed by a flash controller, comprising:
   reading a plurality of physical pages of data in a current block from a flash module during a sudden power off recovery procedure;
   determining whether a power-supply event has occurred according to an error correction result corresponding to read physical pages;
   reconstructing a first flash-to-host mapping (F2H) table to include physical-to-logical mapping (P2L) information from the $0^{th}$ page to a page before a last valid page in the current block when the power-supply event has occurred; and
   programming the reconstructed first F2H table into a location of the flash module.

2. The method of claim 1, comprising:
   reconstructing a second F2H table to include P2L information from the $0^{th}$ page to the last valid page in the current block when the power-supply event hasn't occurred; and
   programming the reconstructed second F2H table into a designated location of the flash module.

3. The method of claim 1, wherein the last valid page indicates a last physical page containing data that is error-free or can be corrected.

4. The method of claim 1, wherein any of the reconstructed first and second F2H tables comprises information indicating which logical address that data stored in each physical page of the current block are related to.

5. The method of claim 1, comprising:
determining that the power-supply event has occurred when the last valid page is a high-error correction (-EC) page and a ratio of high-EC pages in read physical pages of the current block to a total number of the read physical pages of the current block is lower than a threshold,
wherein each high-EC page comprises corrected bits that exceed a percentage of maximum correction capability.

6. The method of claim 1, wherein a page subsequent to the last valid page is an empty page or an uncorrectable error correction code (UECC) page.

7. A non-transitory computer-readable storage medium for accessing to data in response to a power-supply event when executed by a processing unit of a flash controller, the non-transitory computer-readable storage medium comprising program code to:
read a plurality of physical pages of data in a current block from a flash module during a sudden power off recovery procedure;
determine whether a power-supply event has occurred according to an error correction result corresponding to read physical pages;
reconstruct a first flash-to-host mapping (F2H) table to include physical-to-logical mapping (P2L) information from the $0^{th}$ page to a page before a last valid page in the current block when the power-supply event has occurred; and
program the reconstructed first F2H table into a location of the flash module.

8. The non-transitory computer-readable storage medium of claim 7, comprising program code to:
reconstruct a second F2H table to include P2L information from the $0^{th}$ page to the last valid page in the current block when the power-supply event hasn't occurred; and
program the reconstructed second F2H table into a designated location of the flash module.

9. The non-transitory computer-readable storage medium of claim 7, wherein the last valid page indicates a last physical page containing data that is error-free or can be corrected.

10. The non-transitory computer-readable storage medium of claim 7, wherein any of the reconstructed first and second F2H tables comprises information indicating which logical address that data stored in each physical page of the current block are related to.

11. The non-transitory computer-readable storage medium of claim 7, comprising program code to:
determine that the power-supply event has occurred when the last valid page is a high-error correction (-EC) page and a ratio of high-EC pages in read physical pages of the current block to a total number of the read physical pages of the current block is lower than a threshold.

12. The non-transitory computer-readable storage medium of claim 11, wherein each high-EC page comprises corrected bits that exceed a percentage of maximum correction capability.

13. The non-transitory computer-readable storage medium of claim 7, wherein a page subsequent to the last valid page is an empty page or an uncorrectable error correction code (UECC) page.

14. An apparatus for accessing to data in response to a power-supply event, comprising:
a flash interface, coupled to a flash module; and
a processing unit, coupled to the flash interface, arranged operably to drive the flash interface to read a plurality of physical pages of data in a current block from the flash module during a sudden power off recovery procedure; determine whether a power-supply event has occurred according to an error correction result corresponding to read physical pages; reconstruct a first flash-to-host mapping (F2H) table to include physical-to-logical mapping (P2L) information from the $0^{th}$ page to a page before a last valid page in the current block when the power-supply event has occurred; and drive the flash interface to program the reconstructed first F2H table into a location of the flash module.

15. The apparatus of claim 14, wherein the processing unit is arranged operably to reconstruct a second F2H table to include P2L information from the $0^{th}$ page to the last valid page in the current block when the power-supply event hasn't occurred; and drive the flash interface to program the reconstructed second F2H table into a location of the flash module.

16. The apparatus of claim 14, wherein the last valid page indicates a last physical page containing data that is error-free or can be corrected.

17. The apparatus of claim 14, wherein any of the reconstructed first and second F2H tables comprises information indicating which logical address that data stored in each physical page of the current block are related to.

18. The apparatus of claim 14, wherein the processing unit is arranged operably to determine that the power-supply event has occurred when the last valid page is a high-error correction (-EC) page and a ratio of high-EC pages in read physical pages of the current block to a total number of the read physical pages of the current block is lower than a threshold.

19. The apparatus of claim 18, wherein each high-EC page comprises corrected bits that exceed a percentage of maximum correction capability.

20. The apparatus of claim 14, wherein a page subsequent to the last valid page is an empty page or an uncorrectable error correction code (UECC) page.

* * * * *